United States Patent
Hao et al.

(10) Patent No.: US 9,423,839 B2
(45) Date of Patent: Aug. 23, 2016

(54) PLUGBOARD HEAT DISSIPATION SYSTEM

(71) Applicant: Huawei Technologies Co., Ltd., Shenzhen (CN)

(72) Inventors: Mingliang Hao, Shenzhen (CN); Yuan Dong, Shenzhen (CN); Mingxin Feng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/487,517

(22) Filed: Sep. 16, 2014

(65) Prior Publication Data

US 2015/0022968 A1    Jan. 22, 2015

Related U.S. Application Data

(63) Continuation of application No. PCT/CN2013/070212, filed on Jan. 8, 2013.

(30) Foreign Application Priority Data

Aug. 9, 2012 (CN) ........................... 2012 1 0282309

(51) Int. Cl.
*G06F 1/20* (2006.01)
*H05K 7/20* (2006.01)

(52) U.S. Cl.
CPC .............. *G06F 1/20* (2013.01); *H05K 7/20136* (2013.01); *H05K 7/20145* (2013.01); *H05K 7/20563* (2013.01)

(58) Field of Classification Search
CPC .......... G06F 1/20; G06F 1/187; G06F 1/201; H05K 7/20; H05K 7/20136; H05K 7/20563; H05K 7/20572; H05K 5/00; H05K 5/02
USPC ........ 361/679.46–679.5, 690–697, 688, 689, 361/700–724; 165/80.2, 80.3, 104.19, 165/104.21, 104.33, 121–126, 185; 454/184, 290, 303, 354, 306; 174/16.1, 174/15.3, 252; 312/223.2, 236, 265
See application file for complete search history.

(56) References Cited

U.S. PATENT DOCUMENTS 5,006,959 A * 4/1991 Freige ..................... G06F 1/183
165/126
5,119,497 A * 6/1992 Freige ..................... G06F 1/181
361/679.33

(Continued)

FOREIGN PATENT DOCUMENTS

CN          101128097 A       2/2008
CN          101211205 A       7/2008

(Continued)

OTHER PUBLICATIONS

Partial English Translation and Abstract of Chinese Patent Application No. CN101799709A, Nov. 17, 2014, 3 pages.

(Continued)

*Primary Examiner* — Michail V Datskovskiy
(74) *Attorney, Agent, or Firm* — Conley Rose, P.C.; Grant Rodolph; Adam J. Stegge

(57) ABSTRACT

A plugboard heat dissipation system is provided. The system may include a plugboard, an enclosure, and an air supply apparatus that provides an air source for heat dissipation, a length of a first board edge on the plugboard is greater than a length of a second board edge, an output port is disposed on the first board edge, a spatial position of the second board edge is corresponding to that of the first board edge, a connecting part connected to another plugboard orthogonal to the plugboard is disposed, the output port is output out of an enclosure using a first end face of the enclosure, the connecting part is output out of the enclosure using a second end face of the enclosure. In the system, when space in which the plugboard is located is limited, the number of ports on the plugboard can be expanded.

3 Claims, 2 Drawing Sheets

(56) References Cited

U.S. PATENT DOCUMENTS

| | | | | |
|---|---|---|---|---|
| 5,940,288 | A * | 8/1999 | Kociecki | H05K 7/1457 361/688 |
| 6,934,150 | B2 * | 8/2005 | Kitchen | G06F 1/183 361/679.33 |
| 7,558,061 | B2 * | 7/2009 | Franz | F04D 29/646 361/694 |
| 7,722,359 | B1 * | 5/2010 | Frangioso, Jr. | H05K 7/20563 361/679.48 |
| 8,842,431 | B2 * | 9/2014 | Byers | H05K 7/20572 312/223.2 |
| 8,908,372 | B1 * | 12/2014 | West | H05K 7/20563 361/694 |
| 2008/0043451 | A1 | 2/2008 | Sato et al. | |
| 2009/0088009 | A1 | 4/2009 | Dai et al. | |
| 2010/0091458 | A1 * | 4/2010 | Mosier, Jr. | H05K 7/20572 361/695 |
| 2014/0071618 | A1 | 3/2014 | Tian et al. | |

FOREIGN PATENT DOCUMENTS

| | | |
|---|---|---|
| CN | 201119214 Y | 9/2008 |
| CN | 101287344 A | 10/2008 |
| CN | 101399405 A | 4/2009 |
| CN | 101799709 A | 8/2010 |
| CN | 201754647 U | 3/2011 |
| CN | 202196363 U | 4/2012 |
| CN | 102436298 A | 5/2012 |
| CN | 102510707 A | 6/2012 |
| EP | 2590492 A1 | 5/2013 |
| JP | 2005268546 A | 9/2005 |
| JP | 20110034991 A | 2/2011 |
| WO | 2013085465 A1 | 6/2013 |

OTHER PUBLICATIONS

Partial English Translation and Abstract of Chinese Patent Application No. CN101211205A, Nov. 17, 2014, 5 pages.

Foreign Communication From A Counterpart Application, PCT Application No. PCT/CN2013/070212, English Translation of International Search Report dated May 23, 2013, 3 pages.

Foreign Communication From A Counterpart Application, PCT Application No. PCT/CN2013/070212, Written Opinion dated May 23, 2013, 4 pages.

Foreign Communication From A Counterpart Application, Chinese Application No. 201210282309.5, Chinese Office Action dated Aug. 31, 2015, 5 pages.

* cited by examiner

PLUGBOARD HEAT DISSIPATION SYSTEM

CROSS-REFERENCE TO RELATED APPLICATIONS

This application is a continuation of International Application No. PCT/CN2013/070212, filed on Jan. 8, 2013, which claims priority to Chinese Patent Application No. 201210282309.5, filed on Aug. 9, 2012, both of which are hereby incorporated by reference in their entireties.

TECHNICAL FIELD

The present invention relates to the field of electronic communications device technologies, and in particular, to a plugboard heat dissipation system.

BACKGROUND

Currently, in order to improve system integration or perform zoning according to different functions, a device cabin (such as a subrack or a plug-in frame) of some electronic communications devices is divided into a front part and a rear part that are orthogonal to each other. That is, a backplane is disposed in a specific position in the middle of or inside the device cabin, and boards are disposed before and after the backplane. Generally, a front board and a rear board form an orthogonal structure. The front board is a service processing board, the rear board is an interface board for implementing a switching function, and the rear board needs to output plenty of cabling interfaces because the rear board is responsible for the switching function.

In the existing orthogonal structure, the rear board needs to be disposed with an output port, and also needs to implement hot swap. Therefore, a fan that is disposed in the rear part to dissipate heat for the rear board cannot be disposed behind the rear board. General solutions include When the rear board is placed horizontally, the fan is disposed on an upper side and a lower side of the rear board, and air passes through both sides of a group of rear boards and separately gets into fan components located in an upper position and a lower position; and when the rear board is placed upright, a fan component is disposed on the top of the rear board, and air passes through both sides of each rear board and converges into the fan component at the top. In both of the foregoing two solutions, the following heat dissipation manner is applied. Air ducts are disposed on both sides of the rear board, and air is taken in from both sides of the rear board and then gets into the fan component.

However, in the foregoing heat dissipation manner, the rear board generally has complex air ducts with a long path, and system resistance is large. Consequently, a heat dissipation capability of the rear board is limited, and a high-performance fan is generally required to meet a heat dissipation requirement of the rear board. Moreover, the foregoing form of air ducts of the rear board makes cascaded heating exist between panel interfaces. In a case where multiple optical interfaces exist, as affected by a high temperature of an upstream port, it is difficult for a downstream port to dissipate heat, which makes it difficult to enhance the heat dissipation capability of the rear board. In addition, when air is taken in from both sides of the rear board, air duct space needs to be reserved on both sides of the rear board, which restricts dimensions of the rear board and therefore restricts the number of output ports of the rear board.

SUMMARY

In view of this, embodiments of the present invention provide a plugboard heat dissipation system, which can expand the number of ports on a plugboard when space in which the plugboard is located is limited.

An embodiment of the present invention provides a plugboard heat dissipation system, including a plugboard, an enclosure, and an air supply apparatus that provides an air source for heat dissipation, where the plugboard is placed in the enclosure, components are laid out on a surface of the plugboard, radiator accessories are mounted on some of the components, a length of a first board edge on the plugboard is greater than a length of a second board edge, an output port is disposed on the first board edge, a spatial position of the second board edge is corresponding to that of the first board edge, a connecting part connected to another plugboard orthogonal to the plugboard is disposed, the output port is output out of the enclosure using a first end face of the enclosure, the connecting part is output out of the enclosure using a second end face of the enclosure, and a heat dissipation vent is disposed on an end face of the enclosure.

Preferably, the plugboard is a right-angled trapezoid, the first board edge is a hypotenuse of the right-angled trapezoid, and the second board edge is a right-angle side of the right-angled trapezoid.

Preferably, a shape of a cutting surface of the enclosure in a direction parallel to the plugboard is the same as a shape of the plugboard, and the first end face on the enclosure is parallel to a plane on which the output port is located.

Preferably, the heat dissipation vent is disposed on the first end face of the enclosure.

Preferably, the heat dissipation vent is disposed on the third end face of the enclosure, and the third end face is an end face that is on the enclosure and is corresponding to a component area on the plugboard.

Preferably, the heat dissipation vent includes multiple holes.

Preferably, the air supply apparatus includes a fan that is disposed inside or outside the enclosure.

In comparison with the prior art, in the embodiments of the present invention, a length of a first board edge on a plugboard is set to be greater than a length of a second board edge, where an output port is disposed on the first board edge, a spatial position of the second board edge is corresponding to that of the first board edge, and a connecting part connected to another plugboard orthogonal to the plugboard is disposed. Therefore, the length of the board edge that is on the plugboard and is used for disposing the output port increases, and surplus space is available on the corresponding board edge on the plugboard to dispose more ports, so as to expand the number of ports on the plugboard.

BRIEF DESCRIPTION OF DRAWINGS

To describe the technical solutions in the embodiments of the present invention more clearly, the following briefly introduces the accompanying drawings required for describing the embodiments or the prior art. The accompanying drawings in the following description show merely some embodiments of the present invention, and a person of ordinary skill in the art may still derive other drawings from these accompanying drawings without creative efforts.

DESCRIPTION OF EMBODIMENTS

Figure 1:
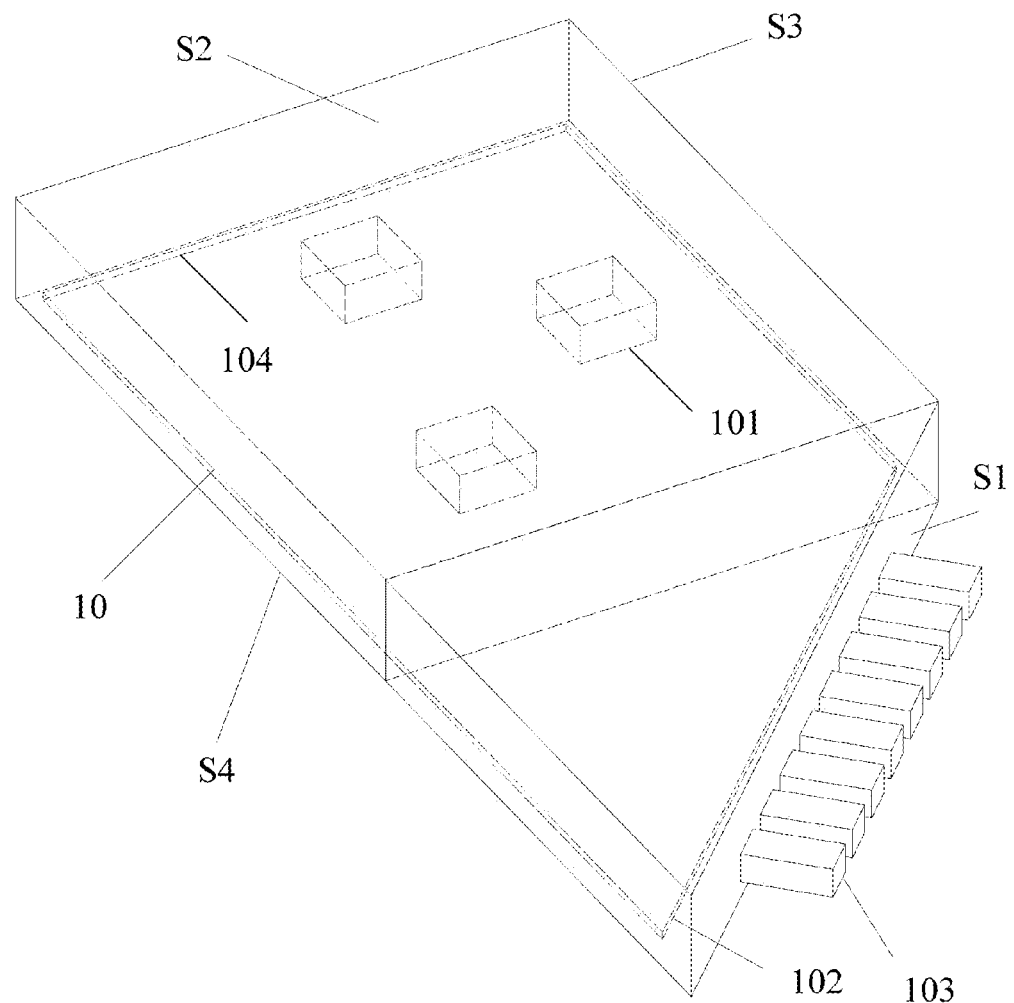
FIG. 1 is a schematic structural diagram of a plugboard heat dissipation system according to Embodiment 1 of the present invention.

The following clearly describes the technical solutions in the embodiments of the present invention with reference to the accompanying drawings in the embodiments of the present invention. The described embodiments are merely a part rather than all of the embodiments of the present invention. All other embodiments obtained by a person of ordinary skill in the art based on the embodiments of the present invention without creative efforts shall fall within the protection scope of the present invention.

The embodiments of the present invention provide a plugboard heat dissipation system, so as to expand the number of ports on a plugboard when space in which the plugboard is located is limited.

First, a plugboard heat dissipation system provided by the embodiments of the present invention is described below. The system includes a plugboard, an enclosure, and an air supply apparatus that provides an air source for heat dissipation, where the plugboard is disposed in the enclosure, components are laid out on a surface of the plugboard, radiator accessories are mounted on some of the components, a length of a first board edge on the plugboard is greater than a length of a second board edge, an output port is disposed on the first board edge, a spatial position of the second board edge is corresponding to that of the first board edge, a connecting part connected to another plugboard orthogonal to the plugboard is disposed, the output port is output out of the enclosure using a first end face of the enclosure, the connecting part is output out of the enclosure using a second end face of the enclosure, and a heat dissipation vent is disposed on an end face of the enclosure.

In the embodiments of the present invention, the length of the first board edge on the plugboard is set to be greater than the length of the second board edge, so as to increase the length of the board edge that is on the plugboard and is used for disposing the output port, so that surplus space is available on the corresponding board edge on the plugboard to dispose more ports, so as to expand the number of ports on the plugboard.

In an exemplary embodiment of the plugboard heat dissipation system provided by the present invention, the plugboard is a right-angled trapezoid, the first board edge is a hypotenuse of the right-angled trapezoid, and the second board edge is a right-angle side of the right-angled trapezoid.

In this embodiment, the plugboard is set to be a right-angled trapezoid. The hypotenuse of the right-angled trapezoid is set to be a first board edge, used for disposing an output port. The right-angle side of the right-angled trapezoid is set to be a second board edge, used for disposing a connecting part connected to another plugboard orthogonal to the current plugboard. A traditional plugboard shape is a regular rectangle or square, and the first board edge and the second board edge are generally two board edges that have corresponding spaces on the plugboard. The two board edges have equal lengths. In the technical solution of the foregoing embodiment, the first board edge is set to be the hypotenuse of the right-angled trapezoid plugboard, and therefore, the length of the first board edge is greater than the length of the second board edge, which increases the length of the first board edge, so that surplus space is available on the first board edge to dispose more ports, so as to expand the number of ports on the plugboard.

It should be noted that, in an implementation, according to an actual application scenario, the plugboard may also be in another irregular shape. According to a requirement for the number of output ports on the first board edge, the first board edge is set to be a shape such as an arc or a saw-tooth shape. The shape of the first board edge that is on the plugboard and is used for disposing an output port is changed to achieve a purpose of increasing the length of the first board edge, so that surplus space is available on the first board edge on the plugboard to dispose more ports, so as to expand the number of ports on the plugboard. For a plugboard of another shape, details are not repeatedly described in the embodiments of the present invention, and a person skilled in the art may perform implementation according to an actual application scenario.

Corresponding to the plugboard, an enclosure is provided by the embodiments of the present invention. To facilitate understanding of the technical solution of the present invention, the following gives a detailed description of an overall solution with reference to specific examples. It should be pointed out that in several enclosure embodiments provided below, description is given by assuming that a right-angled trapezoid is placed in the enclosure.

Embodiment 1

In an embodiment of a plugboard heat dissipation system provided by the present invention, a shape of a cutting surface of an enclosure in a direction parallel to a plugboard is the same as a shape of the plugboard, and a first end face on the enclosure is parallel to a plane on which an output port is located.

FIG. 1 shows a technical solution of an embodiment of a plugboard heat dissipation system provided by this embodiment, where a right-angled trapezoid plugboard 10 is attached to a fourth end face S4 in an enclosure, a component area on the plugboard 10 is oriented to a third end face S3 on the enclosure, components are laid out in the component area, radiator accessories 101 are mounted on some of the components, the third end face S3 is parallel to the fourth end face S4, a first board edge 102 is a hypotenuse on the plugboard 10, an output port 103 is disposed on the first board edge 102, a second board edge 104 is a right-angle side on the plugboard 10, and a connecting part 105 (which is not shown in FIG. 1) connected to another plugboard orthogonal to the plugboard is disposed on the second board edge 104. A shape of a cutting surface of the enclosure in a direction parallel to the plugboard 10 is a right-angled trapezoid, and therefore, both the third end face S3 and the fourth end face S4 are right-angled trapezoids. The first end face S1 on the enclosure is a vertical plane between the third end face S3 and the fourth end face S4. The first end face S1 is parallel to a plane on which the output port 103 is located. The output port 103 is output out of the enclosure using the first end face S1. In addition, the second end face S2 on the enclosure is also a vertical plane between the third end face S3 and the fourth end face S4. The second end face S2 is parallel to a plane on which the connecting part (which is not shown in FIG. 1) is located.

In this embodiment, different from a technical solution in the prior art in which the first end face S1 is parallel to the second end face S2, the first end face S1 is not parallel to the second end face S2, an area of the first end face S1 is greater than an area of the second end face S2, and an area on the first end face S1 by which the first end face S1 is greater than the second end face S2 may be used to dispose an extended output port. If a vacant area is still available on the first end face S1, except space occupied by the output port, a heat dissipation vent may be disposed in the vacant area on the first end face S1. In an implementation, multiple holes may be set to be the heat dissipation vent, and a ventilation air duct may be formed between the holes. An air supply apparatus that provides an air source for heat dissipation may be a fan that is disposed inside or outside the enclosure. Heat of a heating component in a board part on the plugboard is transferred to a radiator, and air that flows through the ventilation air duct can bring heat collected by the radiator out of the enclosure to achieve a purpose of dissipating heat for the plugboard.

In an implementation, heat dissipation holes are provided on the first end face S1 of the enclosure, and heat dissipation holes may also be provided on another end face when a vacant area is available on the another end face. For example, heat dissipation holes are provided on both the first end face S1 and the second end face S2, and therefore, air generated by a fan flows into the enclosure through the heat dissipation holes on the first end face S1, and brings the heat collected by the radiator out of the enclosure through the heat dissipation holes on the second end face S2.

Figure 2:
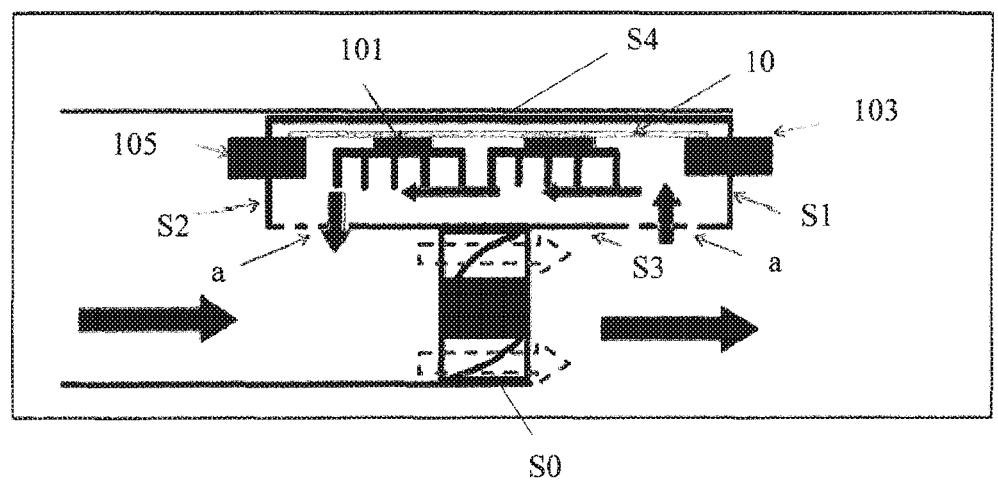
FIG. 2 is a schematic structural diagram of a plugboard heat dissipation system in which heat dissipation holes are provided on a third end face S3 of an enclosure corresponding to FIG. 1.

In addition, if no vacant area is available on the first end face S1 for providing heat dissipation holes, the heat dissipation holes may also be provided on another end face of the enclosure. For example, the heat dissipation holes may also be provided on the third end face S3 of the enclosure. FIG. 2 shows a technical solution of an embodiment of a plugboard heat dissipation system in which heat dissipation holes (labeled "a") are provided on a third end face S3 of an enclosure. The third end face S3 is still an end face to which a component area in a right-angled trapezoid plugboard 10 on the enclosure is oriented. In this embodiment, a fan S0 is disposed outside the enclosure, and an air exhaust direction is oriented to the third end face S3 of the enclosure. Heat dissipation holes "a" may be provided by positions that are on the third end face S3 of the enclosure and corresponding to both sides of the fan S0. Some of the heat dissipation holes "a" may serve as air intake holes, and some may serve as air exhaust holes. Air generated by the fan S0 is led into the enclosure through the air intake holes, and brings heat collected by radiator accessories 101 out of the enclosure through the air exhaust holes, where an air direction is indicated by arrows in FIG. 2. In this embodiment, a position in which the fan S0 is disposed is not limited thereto, and details are not repeatedly described in the embodiment of the present invention.

The described apparatus embodiments are merely exemplary, where the units described as separate parts may or may not be physically separated, and parts shown as units may or may not be physical units, that is, may be located in one position, or may also be distributed on a plurality of network units. A part of or all of the modules may be selected according to an actual need to achieve the objectives of the solutions of the embodiments. A person of ordinary skill in the art may understand and implement the embodiments without creative efforts.

According to the foregoing descriptions of the disclosed embodiments, a person skilled in the art may implement or use the present invention. Various modifications to the embodiments are obvious to a person skilled in the art, and general principles defined in this specification may be implemented in other embodiments without departing from the spirit or scope of the embodiments of the present invention. Therefore, the embodiments of the present invention are not limited to the embodiments described in this specification but shall conform to a maximum scope that is consistent with the principles and new features disclosed in this specification.

What is claimed is:

1. A plugboard heat dissipation system comprising:
a plugboard;
an enclosure; and
an air supply apparatus that provides an air source for heat dissipation,
wherein the plugboard is disposed in the enclosure,
wherein components are laid out on a surface of the plugboard,
wherein radiator accessories are mounted on some of the components,
wherein a length of a first board edge on the plugboard is greater than a length of a second board edge,
wherein an output port is disposed on the first board edge,
wherein a spatial position of the second board edge is corresponding to that of the first board edge,
wherein the output port is output out of the enclosure using a first end face of the enclosure,
wherein a connecting part is output out of the enclosure using a second end face of the enclosure,
wherein the plugboard is a right-angled trapezoid, the first board edge is a hypotenuse of the right-angled trapezoid, and the second board edge is a right-angle side of the right-angled trapezoid,
wherein a shape of a cutting surface of the enclosure in a direction parallel to the plugboard is the same as a shape of the plugboard and the first end face on the enclosure is parallel to a plane on which the output port is located,
wherein heat dissipation vents are disposed on the first end face of the enclosure, and
wherein the air supply apparatus is a fan that is disposed on the enclosure.

2. A plugboard heat dissipation system comprising:
an enclosure having a first end face and a second end face;
a plugboard is a right-angled trapezoid and disposed in the enclosure, wherein a first board edge of the plugboard is a hypotenuse of the right-angled trapezoid and a second board edge of the plugboard is a right-angle side of the right-angled trapezoid;
an air supply apparatus that provides an air source for heat dissipation, wherein the air supply apparatus is a fan that is disposed outside the enclosure;
a plurality of heat dissipation vents comprising air intake holes and air exhaust holes;
a plurality of components laid out on a surface of the plugboard;
a plurality of radiator accessories mounted on a portion of the plurality of components;
an output port is disposed on the first board edge of the plugboard, wherein the output port is output out of the enclosure using the first end face of the enclosure;
wherein a length of the first board edge is greater than a length of the second board edge of the plugboard,
wherein a spatial position of the second board edge corresponds to that of the first board edge,
wherein a shape of a cutting surface of the enclosure in a direction parallel to the plugboard is the same as a shape of the plugboard,
wherein the first end face on the enclosure is parallel to a plane on which the output port is located,
wherein a third end face is an end face on the enclosure and corresponds to a component area on the plugboard, and wherein the plurality of heat dissipation vents are disposed on the third end face of the enclosure.

3. The plugboard heat dissipation system according to claim 2, wherein air generated by the fan is led into the enclosure through the air intake holes and brings heat collected by the radiator accessories out of the enclosure through the air exhaust holes.

* * * * *